United States Patent
Srikantaiah et al.

(10) Patent No.: US 10,811,232 B2
(45) Date of Patent: Oct. 20, 2020

(54) MULTI-PLATE FACEPLATE FOR A PROCESSING CHAMBER

(71) Applicant: Applied Materials, Inc., Santa Clara, CA (US)

(72) Inventors: Deepak Doddabelavangala Srikantaiah, Fremont, CA (US); Sheshraj L. Tulshibagwale, Santa Clara, CA (US); Saravjeet Singh, Sunnyvale, CA (US); Alexander Tam, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/671,909

(22) Filed: Aug. 8, 2017

(65) Prior Publication Data
US 2019/0051499 A1 Feb. 14, 2019

(51) Int. Cl.
*H01J 37/32* (2006.01)
*B05B 1/00* (2006.01)
*B05B 1/18* (2006.01)

(52) U.S. Cl.
CPC ........ *H01J 37/32449* (2013.01); *B05B 1/005* (2013.01); *B05B 1/18* (2013.01); *H01J 37/3244* (2013.01); *H01J 37/32559* (2013.01); *H01J 2237/002* (2013.01)

(58) Field of Classification Search
CPC ........... H01J 37/32449; H01J 37/32559; H01J 2237/002; B05B 1/005; B05B 1/18
USPC ..................................................... 239/533.3
See application file for complete search history.

(56) References Cited

U.S. PATENT DOCUMENTS

| 4,262,631 A | * | 4/1981 | Kubacki | ............... C23C 16/505 |
| | | | | 118/719 |
| 4,532,150 A | * | 7/1985 | Endo | ..................... H01L 21/314 |
| | | | | 257/E21.266 |
| 4,634,601 A | * | 1/1987 | Hamakawa | ............. C23C 16/24 |
| | | | | 136/258 |

(Continued)

FOREIGN PATENT DOCUMENTS

KR 101588265 B1 1/2016

OTHER PUBLICATIONS

International Search Report and Written Opinon for Application No. PCT/US2018/045424 dated Nov. 28, 2018.

*Primary Examiner* — Chee-Chong Lee
(74) *Attorney, Agent, or Firm* — Patterson + Sheridan LLP

(57) ABSTRACT

Embodiments of the disclosure relate to a multi-plate faceplate having a first plate and a second plate. The first plate has a plurality of first plate openings. The second plate has a first surface, an opposed second surface and a plurality of second plate openings extending therethrough. The first surface is mechanically coupled to the first plate. A second plate opening has a conical portion configured to be fluidly coupled to a first plate opening and decreasing in cross-section in the depth direction thereof from the second surface. A surface of the conical portion is coated with a protective coating adjacent to the first and second surfaces. In another embodiment, the first plate has a protrusion extending therefrom into a recess formed inwardly of the first surface. The protrusion has a passage extending therethrough fluidly connected to the recess, which is fluidly connected to the second plate opening.

15 Claims, 5 Drawing Sheets

(56) References Cited

U.S. PATENT DOCUMENTS

| | | | |
|---|---|---|---|
| 4,759,947 A * | 7/1988 | Ishihara | C23C 16/24 |
| | | | 136/258 |
| 5,500,256 A * | 3/1996 | Watabe | C23C 16/45561 |
| | | | 118/715 |
| 6,969,489 B2 * | 11/2005 | Freeman | B01L 3/5025 |
| | | | 422/50 |
| 7,270,713 B2 * | 9/2007 | Blonigan | C23C 16/455 |
| | | | 118/715 |
| 9,082,593 B2 * | 7/2015 | Hayashi | H01J 37/32449 |
| 2004/0129211 A1 | 7/2004 | Blonigan et al. | |
| 2008/0295965 A1 | 12/2008 | Nogami et al. | |
| 2009/0071407 A1 * | 3/2009 | Kuznetsov | C23C 16/045 |
| | | | 118/728 |
| 2015/0214009 A1 | 7/2015 | Glukhoy | |
| 2016/0005571 A1 | 1/2016 | Della Rosa et al. | |

\* cited by examiner

MULTI-PLATE FACEPLATE FOR A PROCESSING CHAMBER

BACKGROUND

Field

Embodiments of the disclosure generally relate to an apparatus for semiconductor device manufacturing. More particularly, the disclosure relates to a multi-plate faceplate for use within a semiconductor device processing chamber.

Description of the Related Art

Semiconductor device geometries have dramatically decreased in size since their introduction several decades ago. Increasing device densities have resulted in structural features having decreased spatial dimensions. Some manufacturing processes for fabricating semiconductor devices, such as plasma etching and plasma cleaning processes, expose a semiconductor substrate to a plasma in order to etch or clean the substrate. The plasma gas species may be highly corrosive, and therefore corrode processing chamber components and other surfaces that are exposed to the plasma.

Some plasma processing chambers include a plasma generation section that provides energized species to a substrate processing portion of the chamber. Traditionally, components of the chamber exposed to plasma, such as showerheads and diffusers, have been coated with a plasma resistant coating to prevent erosion or corrosion of the components.

To provide process gases to the chamber, a faceplate having a plurality of gas flow passages which form gas discharge openings extending therethrough is known. Often, the gas flow passages through the faceplate comprise a plurality of openings of different diameters fluidly connected through the body of the faceplate. In some constructs, the openings opening to a surface of the faceplate have a larger diameter than the openings in fluid communication therewith and extending further into the body of the faceplate therefrom. For example, a conical opening may open to the surface of the faceplate facing the reaction volume of a semiconductor process chamber, such as a plasma region thereof. These conical openings are often coated with a corrosion resistant material, an erosion resistant material, or an erosion and corrosion resistant material, to prevent the process gases, including energized plasma species, or a cleaning gas or material, from significantly changing the dimensions thereof as a result or erosion or corrosion thereof. A plasma spray process is a well-known coating process where the coating material combines in a plasma region of a plasma spray tool and then ballistically travels to the surface to be coated. However, due to the geometry of the openings, particularly where an opening having a larger cross-sectional area at the surface of the faceplate narrows within the body of the faceplate into an opening having a smaller cross-sectional area, as the stream of material from the plasma spray tool travels towards the surfaces to be coated, it pushes air ahead of it and into the opening having an inwardly tapered cross section. As the flow through the opening having a smaller cross-sectional area at the base of the tapered opening is constrained compared to the flow entering the inwardly tapered conical opening, the backpressure in the opening having a smaller cross-sectional area and in the inner portion of the inwardly tapered opening increases, thereby decreasing the flux of plasma spray material reaching the base of the inwardly tapered. As a result, the thickness of the coating decreases in the depth direction of the inwardly tapered openings of the faceplate, and in some cases, non-coated regions or areas remain along the innermost surface of the inwardly tapered opening. This results in direct exposure of the uncoated surfaces to process gases, plasma and plasma byproducts, as well as the cleaning materials, which are often corrosive or erosive to the unprotected surface. The useful lifetime of the faceplate is reduced as a result, requiring premature replacement thereof. Similarly, where a showerhead is configured with gas discharge openings of a similar configuration, the same issues arise.

Thus, there is a need for an improved faceplate with a uniformly applied protective coating to increase the lifetime of the component.

SUMMARY

Embodiments of the disclosure relate to a multi-piece gas discharge apparatus, for example, a multi-plate faceplate, for use in a semiconductor processing chamber. In one embodiment, the multi-plate faceplate includes a first plate and a second plate. The first plate has a plurality of first plate openings. The second plate has a first surface, an opposed second surface and a plurality of second plate openings extending through the second plate. The first surface is mechanically coupled to the first plate. A second plate opening has a conical portion configured to be fluidly coupled to a first plate opening, the conical portion decreasing in cross-section in the depth direction thereof from the second surface of the second plate. The surface of the conical portion is coated with a protective coating between the first surface and the second surface.

Another embodiment of the disclosure provides a multi-piece gas discharge apparatus, for example, a multi-plate faceplate including a first plate and a second plate. The first plate has a plurality of first plate openings. The second plate has a first surface, an opposed second surface and a plurality of second plate openings extending through the second plate. The first surface is mechanically coupled to the first plate. A second plate opening has a conical portion configured to be fluidly coupled to a first plate opening, the conical portion decreasing in cross-section in the depth direction thereof from the second surface of the second plate. The surface of the conical portion is coated with a protective coating.

Yet another embodiment of the disclosure provides a multi-piece gas discharge apparatus, for example, a multi-plate faceplate including a first plate and a second plate. The first plate has a plurality of first plate openings. The second plate has a first surface, an opposed second surface and a plurality of second plate openings extending through the second plate. The first surface is mechanically coupled to the first plate. A second plate opening has a conical portion configured to be fluidly coupled to a first plate opening. The first plate has a protrusion extending therefrom into a recess formed inwardly of the first surface of the second plate. The protrusion has a passage extending therethrough fluidly connected to the recess. The recess is fluidly connected to the second plate opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

Figure 1:
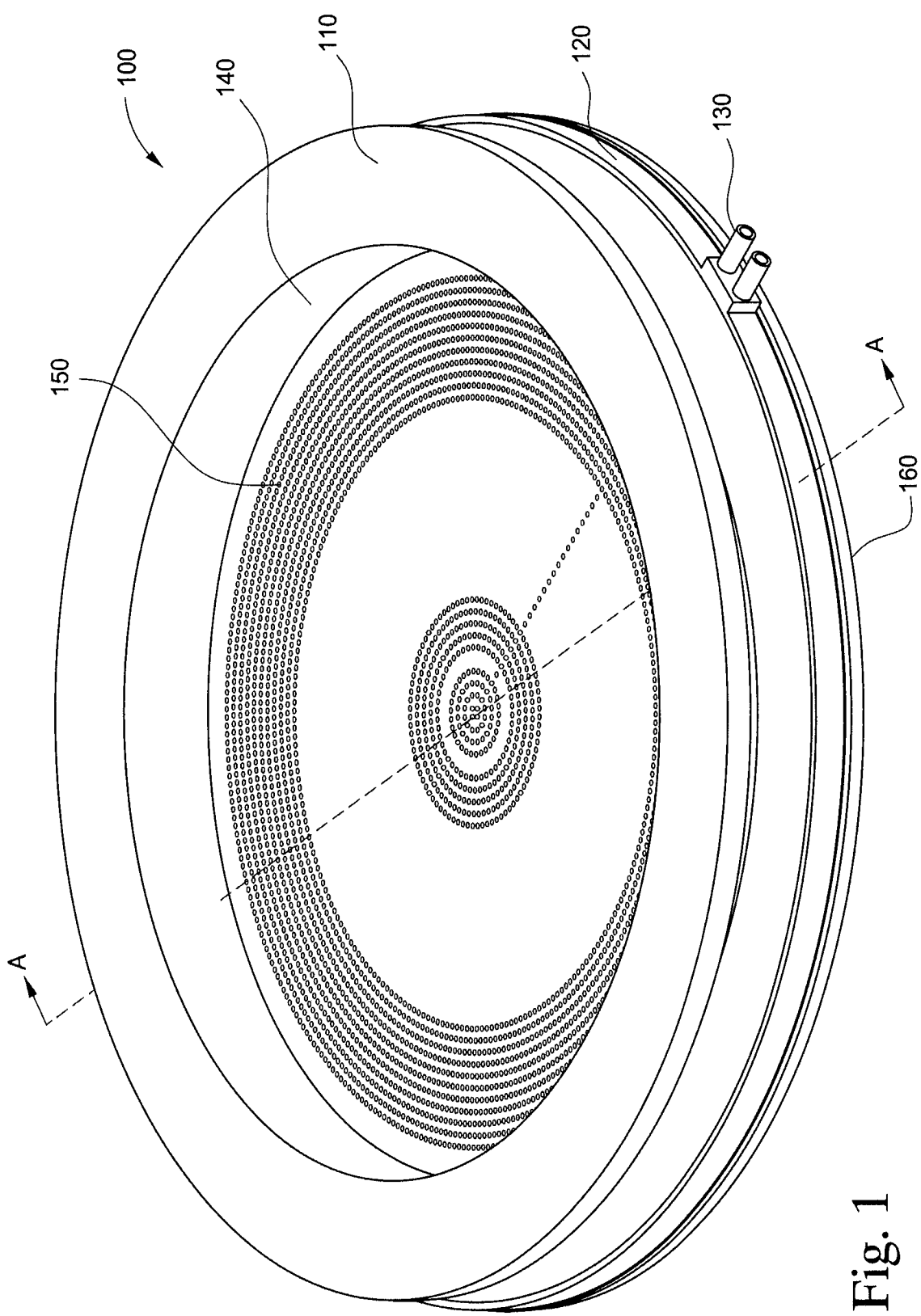
FIG. 1 is an isometric view of a multi-plate faceplate for use within a plasma processing chamber.

To facilitate understanding, identical reference numerals have been used, where possible, to designate identical elements that are common to the figures. It is contemplated that elements and features disclosed in one embodiment may be beneficially incorporated in other embodiments without specific recitation thereof.

DETAILED DESCRIPTION

The disclosure described herein concerns a diffuser for use in a plasma processing chamber. As an exemplary embodiment thereof, a faceplate composed of a first place and a second plate, i.e., a multi-plate faceplate is described herein. However, the embodiments described herein can be applied to other gas diffuser apparatuses having gas flow openings extending therethrough, where the geometry of the openings prevents the placement of a proper protective coating on the surface of the opening, such as showerheads. By configuring the faceplate to incorporate a first plate and a second plate, and splitting the gas flow passages therebetween, a coating on the surface of the openings of the second plate of the multi-plate faceplate which are exposed to the process environment of a semiconductor process chamber can be uniformly applied thereto, even where the overall construct of the faceplate would result in a non-uniform coating application on the same portion of the opening in a single piece faceplate. Where, as a result of use in an erosive or corrosive environment or cleaning(s) using erosive or corrosive cleaning processes or materials, the faceplate needs to be replaced, the multi-plate design enables that only the second plate need be replaced instead of the entire faceplate, thereby reducing cost of ownership of the process chamber within which the faceplate is used.

The multi-plate faceplate 100 described herein may be used in a semiconductor processing chamber wherein a process gas is used for processing a substrate, such as by depositing a layer of material thereon, or etching a layer or a portion of a layer thereon, or otherwise treating the substrate. This includes plasma processing of a semiconductor substrate or other substrate, where the openings through the second plate are exposed to a plasma environment or an environment where plasma generated radicals are present. The openings on the second plate have a thin film of plasma resistant coating, such as but not limited to a ceramic coating, applied on one or more surfaces thereof. The coating provides corrosion resistance to protect the faceplate from the process gases in a corrosive semiconductor process environment. Ceramic coatings useful herein include at least yttrium oxide ($Y_2O_3$) and aluminum oxide ($Al_2O_3$), among others. A desirable coating has a high density, high thickness uniformity and low surface roughness variation over the surfaces on which it is applied. This protects the faceplate surfaces exposed to the process environment, particularly the inner surfaces of the openings on the second plate, from erosion or corrosion otherwise resulting from the process environment. The coating is also intended to protect the critical dimensions of the openings from being significantly altered during substrate processing or cleaning, which would change the gas distribution characteristics of the faceplate and require replacement thereof.

Figure 2:
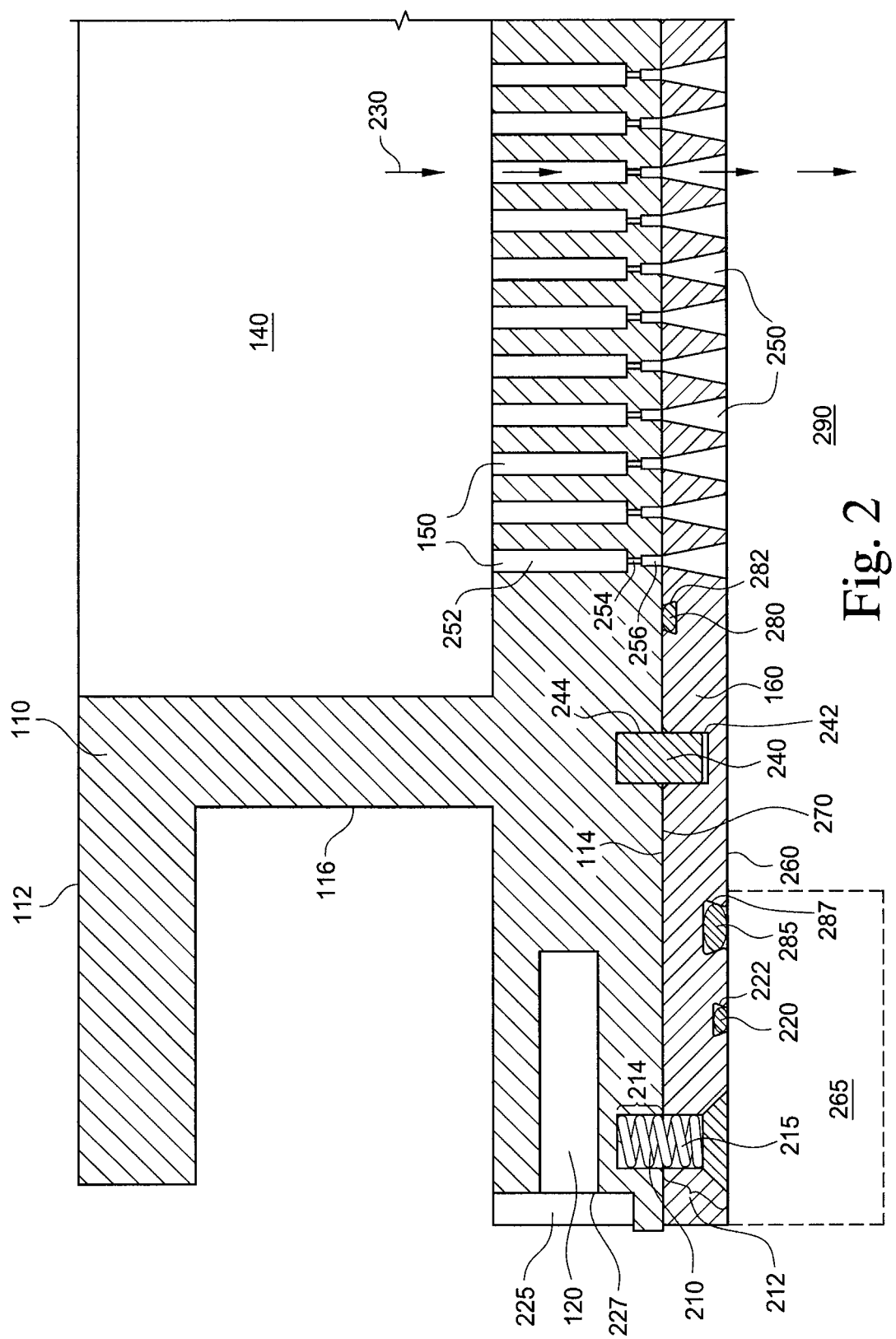
FIG. 2 is a cross-sectional view of the multi-plate faceplate.

FIG. 1 shows an isometric view of a multi-plate faceplate 100 for use within a plasma processing chamber, while FIG. 2 shows a cross-sectional view of the multi-plate faceplate 100 along the plane A-A as referenced in FIG. 1. The multi-plate faceplate 100 includes a first plate 110 and a second plate 160. Both the first plate 110 and the second plate 160 are fabricated from a conductive material, such as but not limited to aluminum. The multi-plate faceplate 100 can serve as an electrode for generation of a plasma in an adjacent process volume when an AC potential is applied thereto. The first plate 110 has an annular first surface 112, a disk-shaped second surface 114 opposing the first surface 112 and a circumferential wall 116. In the embodiment shown in FIG. 2, the circumferential wall 116 extends upwardly to surround a central aperture 140. The central aperture 140 lies between the first surface 112 and the second surface 114. The central aperture 140 is fluidly connected to the second surface 114 by a plurality of first plate openings 150 extending therebetween. A horizontal channel 120 extends inwardly of the sidewall of the first plate 110 and is fluidly connected to a pair of conduits 130. An end 227 of the horizontal channel 120 is covered by a vertical strap 225 that is welded to the circumferential wall 116 of the first plate 110 to surround the horizontal channel 120, as shown in FIG. 2. A cooling fluid, such as a heat transfer fluid, is delivered through one of the conduits 130 and flows therefrom around the perimeter of the first plate 110 and exits therefrom through a second one of the conduits 130. The cooling fluid is configured to cool the first plate 110 and the second plate 160 during substrate processing using the faceplate. One or more cylindrical mounting holes 214 extend inwardly of the second surface 114 of the first plate 110. One or more dowel pin holes 244 extend inwardly of the second surface 114.

Each first plate opening 150 has three portions—a first opening portion 252, a second opening portion 254 and a third opening portion 256, where the second opening portion 254 is disposed between the first and third opening portions and forms an orifice or flow choke in a fluid path 230 between the first opening portion 252 and the third opening portion 256. In the embodiment shown in FIG. 2, the first opening portion 252, the second opening portion 254 and the third opening portion 256 are cylindrical in shape with a circular cross-section, though in other embodiments, the cross-section may have any closed shape. The third opening portion 256 has a larger diameter than the second opening portion 254 and it opens into the second surface 114 of the first plate 110. The first opening portion 252 has a larger diameter than the third opening portion 256 and opens into the central aperture 140 of the first plate 110. When mounted into a semiconductor processing chamber, the central aperture forms a plenum for process gas to be flowed through the multi-plate faceplate 100.

The second plate 160 is mechanically coupled to the second surface 114 of the first plate 110 along a first surface 270 of the second plate 160 by fasteners, such as threaded fasteners (only one shown). The second plate 160 also includes a second surface 260, opposed to the first surface 270. Either one or both of the first surface 270 and the second surface 260 may be plasma sprayed with the plasma resistant coating as discussed above. The second plate 160 has a plurality of second plate openings 250 extending therethrough between the first surface 270 and the second surface 260. Each second plate opening 250 includes a conical portion that is sized or otherwise configured to be fluidly coupled to each first plate opening 150 such that a fluid from the central aperture 140 can flow along the fluid path 230 through the plurality of first plate openings 150 and the plurality of second plate openings 250 into a secondary region 290 below the multi-plate faceplate 100. One or more cylindrical mounting holes 212 extend inwardly of the first surface 270 of the second plate 160. One or more dowel pin holes 242 extend inwardly of the first surface 270 of the second plate 160. A Heli-Coil® threaded insert 210 is located and secured within the mounting hole 212 to receive threads of a threaded fastener 215 extending through, and secured against, the second plate 160 therein, thereby securing the first plate 110 to the second plate 160. A dowel pin 240, fabricated from stainless steel, is received in the dowel pin holes 242 and 244 to align the first plate 110 with the second plate 160 when they are secured together.

The second plate 160 includes an RF gasket 220 located and secured within a recess 222 extending inwardly of, and circumferentially around, the second surface 260. The RF gasket 220 acts as an electrical isolator to prevent RF power leakage. The second plate 160 includes a seal 280, such as but not limited to an O-ring, configured to seal against the base of a seal groove 282 in the first surface 270 of the second plate 160 and the second surface 114 of the first plate 110. Additionally, the second surface 260 also includes another seal 285, such as but not limited to an O-ring, which is configured to seal against a surface of an annular chamber component 265. The seal 285 is located and secured within a recess 287 extending inwardly of, and circumferentially around, the second surface 260. In one aspect, the multi-plate faceplate 100 aces a plasma generation region 290.

The splitting of the faceplate into a first plate 110 and a second plate 160 favorably allows the process resistant coating to be applied uniformly within the second plate openings 250, which are now accessible from both the first surface 270 and the second surface 260 of the second plate 160. As a result, the constraints imposed while coating the surfaces of the openings extending through a single-piece faceplate having a combined thickness of the first plate 110 and the second plate 160, are eliminated. More importantly, the separate second plate 160 eliminates the problem of backpressure restricting access of the coating material to the base of the inwardly tapered openings 250, particularly in portions thereof having smaller cross-sectional areas, and thereby affecting the uniform application of the coating layer on the surfaces thereof. In the absence of a constricted spray path, the coating can be applied easily and uniformly on the surfaces of the second plate openings 250. Additionally, herein, the smallest diameter portion of the openings through both the first and the second plate is present in the first plate, where the protective coating is not needed. By having the smallest opening, i.e., an orifice or flow choke, in the first plate, the overall size of the openings through the second plate can be increased in diameter, they can be accessed from both sides of the second plate, and they can be sized such that a backpressure condition leading to uneven application of a protective coating is avoided.

Figure 3:
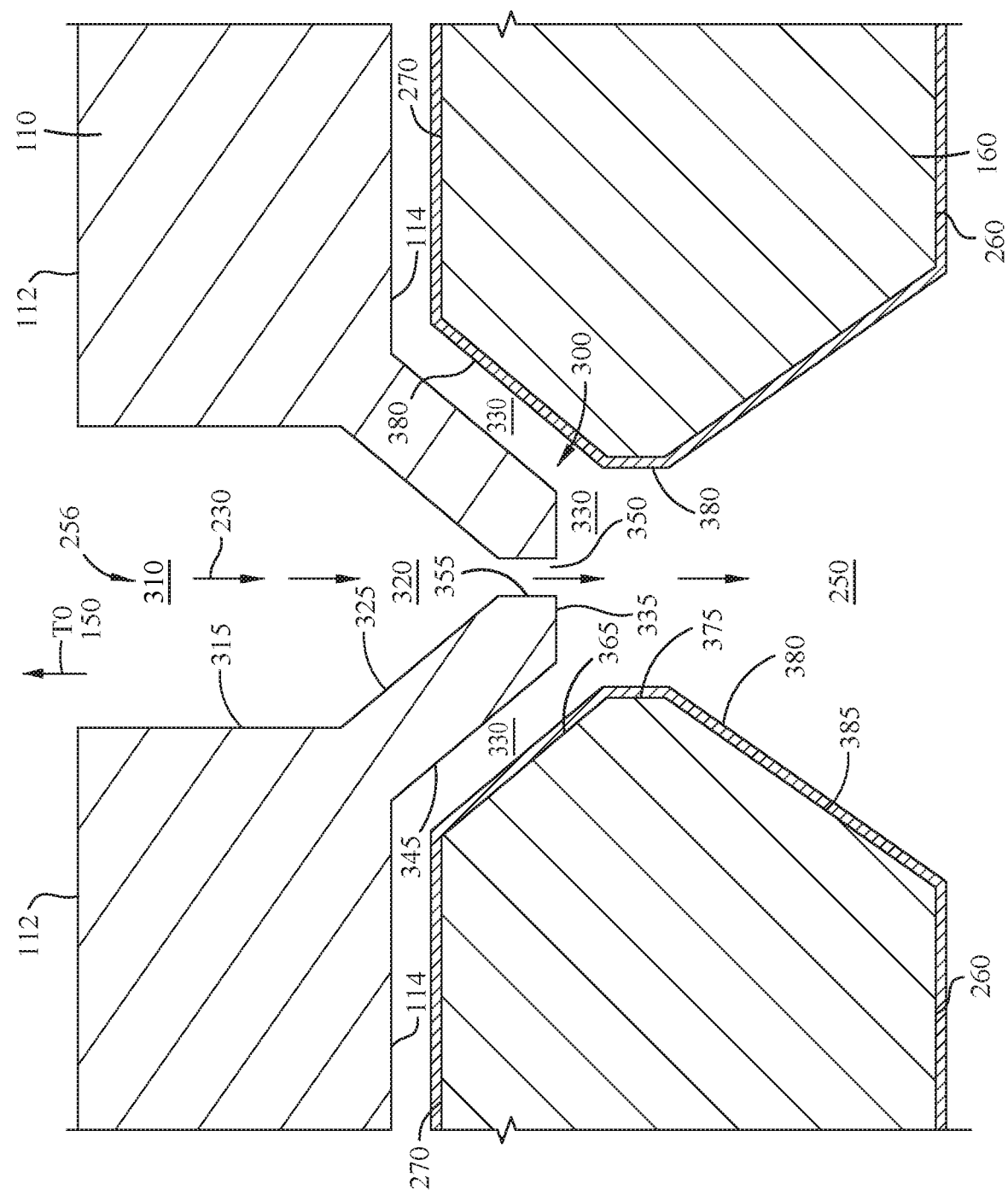
FIG. 3 is a cross-sectional view of a junction between a first plate and a second plate of the multi-plate faceplate of FIG. 1, according to a first embodiment of the present disclosure.
Figure 4:
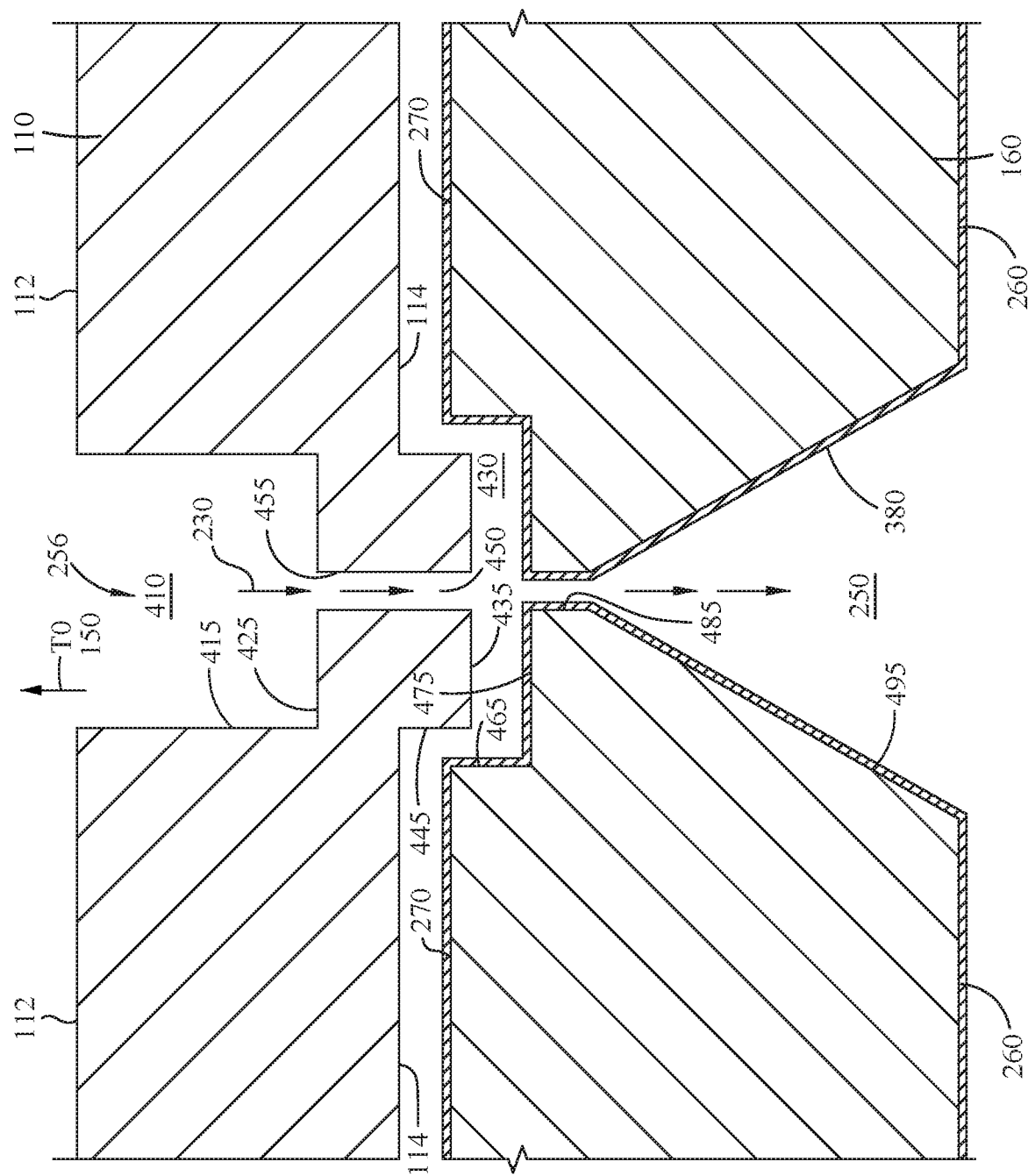
FIG. 4 is a cross-sectional view of a junction between a first plate and a second plate of the multi-plate faceplate of FIG. 1, according to a second embodiment of the present disclosure.
Figure 5:
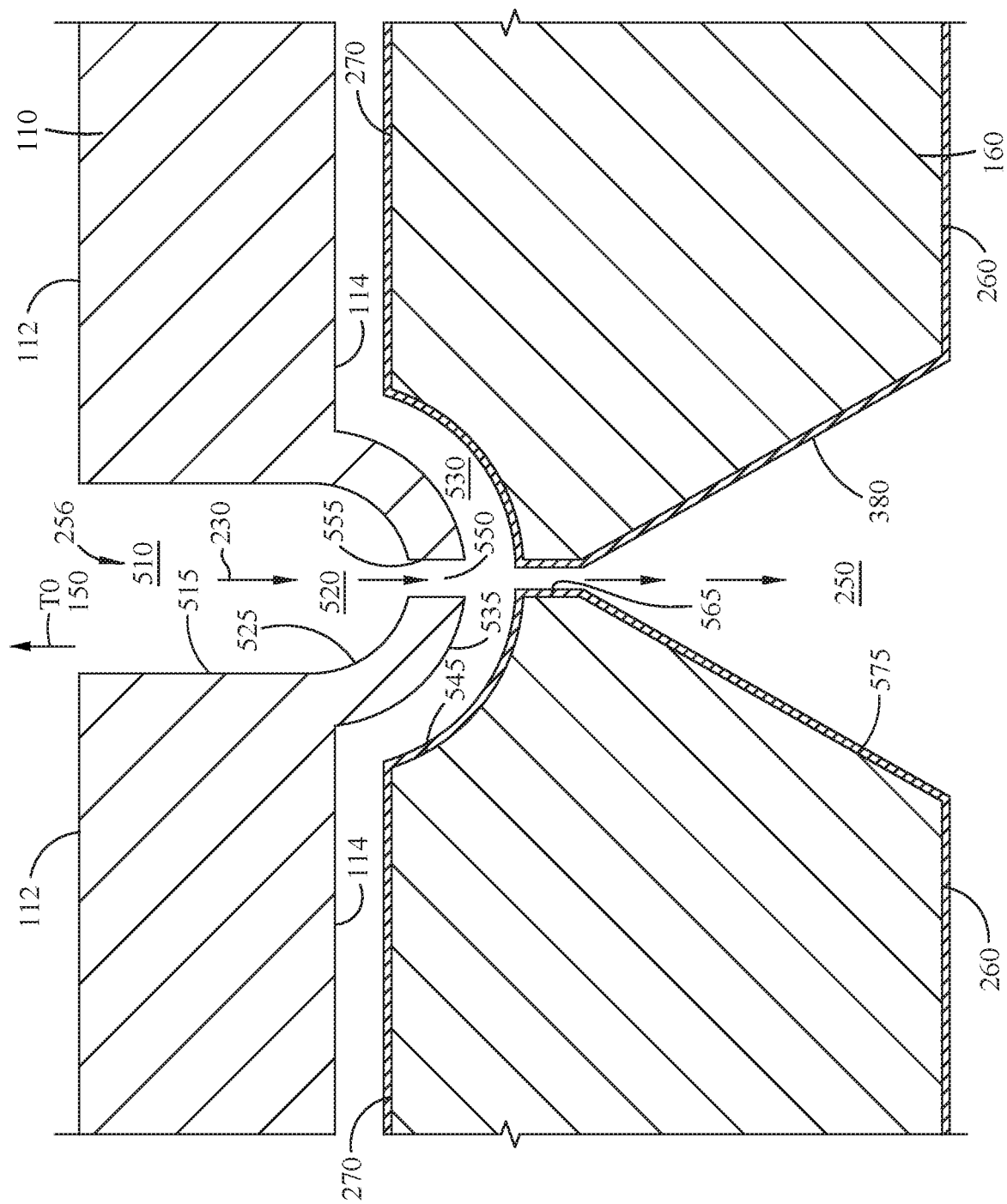
FIG. 5 is a cross-sectional view of a junction between a first plate and a second plate of the multi-plate faceplate of FIG. 1, according to a third embodiment of the present disclosure.

FIGS. 3, 4 and 5 show embodiments of the junction between the first plate 110 and the second plate 160 of the multi-plate faceplate 100, at a location where the first plate opening 150 is fluidly coupled to the second plate opening 250. The junction between the first plate 110 and the second plate 160 is aligned with the third opening portion 256 of the first plate opening 150. In FIG. 3, the third opening portion 256 has three portions—a first region 310 surrounded by a first cylindrical sidewall 315, a second region 320 surrounded by a first frustoconical wall 325 and a passage 350 surrounded by a second cylindrical sidewall 355. The second region 320 lies between the first region 310 and the passage 350. The passage 350 has a smaller cross-sectional area than the upper region 310 of the third opening portion 256. The first region 310 transitions into the passage 350 via the second region 320, which tapers inwardly between the first region 310 and the passage 350. The second cylindrical sidewall 355 transitions into a transverse wall 335, which further transitions into a second frustoconical wall 345 parallel to the first frustoconical sidewall 325. The first frustoconical wall 325, the second cylindrical sidewall 355, the transverse wall 335 and the second frustoconical wall 345 thus form a protrusion 300 extending from the second surface 114 of the first plate 110. Each protrusion 300 extends outwardly into a recess 330 formed inwardly of the first surface 270 of the second plate 160. The recess 330 forms a countersink opening that is fluidly connected to the second plate opening 250, which tapers outwardly in the direction of the fluid path 230. The recess 330 is surrounded by a third frustoconical wall 365 parallel to the second frustoconical wall 345 of the protrusion 300. The third frustoconical wall 365 transitions into a third cylindrical sidewall 375, which further transitions into a fourth frustoconical wall 385 surrounding the second plate opening 250. The passage 350 of the third opening portion 256 extending through the protrusion 300 thus fluidly connects the first plate opening 150 with the second plate opening 250.

In FIG. 4, the third opening portion 256 has two portions—a first region 410 surrounded by a first cylindrical sidewall 415 and a passage 450 surrounded by a second cylindrical sidewall 455. The passage 450 has a smaller cross-sectional area than the first region 410 of the third opening portion 256. The first region 410 transitions into the passage 450 via a first transverse wall 425. The second cylindrical sidewall 455 transitions into a second transverse wall 435, which further transitions into a third cylindrical sidewall 445 parallel to the second cylindrical sidewall 455. The first transverse wall 425, the second cylindrical sidewall 455, the second transverse wall 435 and the third cylindrical sidewall 445 thus form a protrusion 400 extending from the second surface 114 of the first plate 110. Each protrusion 400 extends outwardly into a recess 430 formed inwardly of the first surface 270 of the second plate 160. The recess 430 provides a counterbore that is fluidly connected to the second plate opening 250 which tapers outwardly in the direction of the fluid path 230. The recess 430 is surrounded by a fourth cylindrical sidewall 465 that is parallel to the third cylindrical sidewall 445 of the protrusion 400. The fourth cylindrical sidewall 465 transitions into a third transverse wall 475 that is parallel to the second transverse wall 435. The third transverse wall 475 transitions into a fifth cylindrical sidewall 485 that is parallel to the third cylindrical sidewall 445. The fifth cylindrical sidewall 485 further transitions into a frustoconical wall 495 surrounding the second plate opening 250. The passage 450 of the third opening portion 256 extending through the protrusion 400 thus fluidly connects the first plate opening 150 with the second plate opening 250.

In FIG. 5, the third opening portion 256 has three portions—a first region 510 surrounded by a first cylindrical sidewall 515, a second region 520 surrounded by a first hemispherical sidewall 525 and a passage 550 surrounded by a second cylindrical sidewall 555. The passage 550 has a smaller cross-sectional area than the first region 510 of the third opening portion 256. The first region 510 transitions into the passage 550 via the second region 520, which curves inwardly between the first region 510 and the passage 550. The second cylindrical sidewall 555 transitions into a second hemispherical sidewall 535 parallel to the first hemispherical sidewall 525. The first hemispherical sidewall 525, the second cylindrical sidewall 555 and the second hemispherical sidewall 535 thus form a protrusion 500 extending from the second surface 114 of the first plate 110. Each protrusion 500 extends outwardly into a recess 530 formed inwardly of the first surface 270 of the second plate 160. The recess 530 is fluidly connected to the second plate opening 250, which tapers outwardly in the direction of the fluid path 230. The recess 530 is surrounded by a third hemispherical sidewall 545 that is parallel to the first hemispherical sidewall 525 of the protrusion 500. The third hemispherical sidewall 545 transitions into a third cylindrical sidewall 565, which further transitions into a frustoconical wall 575 surrounding the second plate opening 250. The passage 550 of the third opening portion 256 extending through the protrusion 500 thus fluidly connects the first plate opening 150 with the second plate opening 250.

The first plate 110 and the second plate 160 are manufactured separately. After manufacture, the first plate 110 and the second plate 160 are cleaned. The first surface 270, the second surface 260, and the entirety of the walls of the openings 250 of the second plate 160 are then coated with a plasma resistant coating 380 using a plasma spray process. For example, in FIG. 3, the coating 380 is applied over the third frustoconical wall 365, the third cylindrical wall 375, the fourth frustoconical wall 385, the first surface 270, and the second surface 260. In FIG. 4, the coating 380 is applied over the fourth cylindrical sidewall 465, the third transverse wall 475, the fifth cylindrical sidewall 485, the frustoconical wall 495, the first surface 270, and the second surface 260. In FIG. 5, the coating 380 is applied over the third hemispherical sidewall 545, the third cylindrical sidewall 565, the frustoconical wall 575, the first surface 270, and the second surface 260.

The first plate 110 and the second plate 160 are then assembled together. First, the seal 280 is placed on the recess 282. The dowel pin 240 is placed through the dowel pin hole 244 on the first plate 110. The Heli-Coil® threaded insert 210 is placed through the mounting hole 214 on the first plate 110. The dowel pin 240 is aligned to be received into the dowel pin hole 242 on the bottom plate 160, thereby also aligning the mounting hole 212 with the mounting hole 214 having the threaded insert 210 place within. A threaded fastener 215 is placed inwardly of mounting hole 212 and threaded into the threaded insert 210 in the hole 214 to secure the first plate 110 and the second plate 160 together to form the multi-plate faceplate 100. At the same time, the seal 280 is used to seal against the first plate 110 and the second plate 160. The RF gasket 220 is secured within the recess 222 on the second surface 260 of the second plate 160. Then, the seal 285 is secured within the recess 287 on the second surface 260 of the second plate 160 to seal against the annular chamber component 265 in the plasma generation section 290 below the multi-plate faceplate 100.

The construct of the multi-plate faceplate 100 described herein enables plasma spraying a uniform protective layer of, for example, a ceramic composition having high uniformity of both thickness and surface roughness over the entire surface of the openings 250. The coating protects the second plate openings 250 from erosion and corrosion during use for a longer period of time than the non-uniform layer in the openings of the single-block faceplate.

Additionally, the multi-plate design allows only the second plate 160 to be replaced, when necessary, with another second plate 160, thus eliminating the need to dispose of the entire faceplate. The first plate 110 can be reused with a different second plate 160. Since the first plate 110 and the second plate 160 can be cleaned and reused, the cost of ownership is reduced. Finally, in the embodiments described herein, by incorporation of a horizontal channel 120 in the first plate 110, the need to gun-drill holes for cooling purposes is also eliminated.

While the foregoing is directed to particular embodiments of the present disclosure, it is to be understood that these embodiments are merely illustrative of the principles and applications the present invention. It is therefore to be understood that numerous modifications may be made to the illustrative embodiments to arrive at other embodiments without departing from the spirit and scope of the present inventions, as defined by the appended claims.

What is claimed is:

1. A multi-plate faceplate for use in a plasma processing chamber, the multi-plate faceplate comprising:
   a first plate having a plurality of first plate openings, each of the first plate openings comprising a first cylindrical wall that interfaces with a first conical wall surrounded by a second conical wall defining a protrusion; and
   a second plate having a first surface, an opposed second surface and a plurality of second plate openings extending through the second plate, the first surface mechanically coupled to the first plate,
   wherein a second plate opening of the plurality of second plate openings has a first conical portion configured to be fluidly coupled to a corresponding first plate opening of the plurality of first plate openings, the first conical portion tapering from the first surface to the second surface to interface with a second cylindrical wall and the second cylindrical wall interfaces with a second conical portion that tapers outwardly from the second cylindrical wall to the second surface,
   wherein the protrusion extends into and is surrounded by the first conical portion, and
   wherein a surface of the first conical portion and the second conical portion of the second plate opening is coated with a protective coating.

2. The multi-plate faceplate of claim 1 further comprising:
   a first dowel pin hole extending inwardly of the first plate;
   a second dowel pin hole extending inwardly of the second plate; and
   at least one dowel pin configured to extend inwardly of the first dowel pin hole and the second dowel pin hole.

3. The multi-plate faceplate of claim 1 further comprising:
   an O-ring configured to seal against the first plate and the second plate.

4. The multi-plate faceplate of claim 1 further comprising:
   a channel disposed within the first plate.

5. The multi-plate faceplate of claim 1 further comprising:
a passage extending through the protrusion and fluidly connected with the first conical portion, the passage having a smaller cross-sectional area than the first plate opening.

6. A multi-plate faceplate for use in a plasma processing chamber, the multi-plate faceplate comprising:
a first plate having a plurality of first plate openings, each of the first plate openings comprising a first cylindrical wall that interfaces with a first conical wall surrounded by a second conical wall defining a protrusion; and
a second plate having a first surface, an opposed second surface and a plurality of second plate openings extending through the second plate, the first surface mechanically coupled to the first plate,
wherein each second plate opening of the plurality of second plate openings has a first conical portion configured to be fluidly coupled to a corresponding first plate opening of the plurality of first plate openings, the first conical portion tapering inwardly from the first surface to interface with a second cylindrical wall and the second cylindrical wall interfaces with a second conical portion that tapers outwardly from the second cylindrical wall to the second surface,
wherein the protrusion extends into and is surrounded by the first conical portion, and
wherein a surface of the second conical portion is coated with a protective coating.

7. The multi-plate faceplate of claim 6 further comprising:
a first dowel pin hole extending inwardly of the first plate;
a second dowel pin hole extending inwardly of the second plate; and
at least one dowel pin configured to extend inwardly of the first dowel pin hole and the second dowel pin hole.

8. The multi-plate faceplate of claim 6 further comprising:
an O-ring configured to seal against the first plate and the second plate.

9. The multi-plate faceplate of claim 6 further comprising:
a channel disposed within the first plate.

10. The multi-plate faceplate of claim 6 further comprising:
a passage extending through the protrusion and fluidly connected with the first conical portion, the passage having a smaller cross-sectional area than the first plate opening.

11. A multi-plate faceplate for use in a plasma processing chamber, the multi-plate faceplate comprising:
a first plate comprising an aluminum material and having a plurality of first plate openings, each of the first plate openings comprising a cylindrical wall that interfaces with a first conical wall surrounded by a second conical wall defining a protrusion; and
a second plate comprising an aluminum material and having a first surface, an opposed second surface and a plurality of second plate openings extending through the second plate, the first surface mechanically coupled to the first plate,
wherein a second plate opening of the plurality of second plate openings has a first conical portion configured to be fluidly coupled to a corresponding first plate opening of the plurality of first plate openings, the first conical portion tapering inwardly from the first surface to interface with a second cylindrical wall and the second cylindrical wall interfaces with a second conical portion that tapers outwardly from the second cylindrical wall to the second surface, and
wherein the protrusion of each of the first plate openings extends into and is surrounded by the first conical portion of a corresponding second plate opening of the plurality of second plate openings of the second plate, the protrusion of each of the first plate openings having a passage extending therethrough fluidly connected to the first conical portion of a corresponding second plate opening.

12. The multi-plate faceplate of claim 11 further comprising:
a first dowel pin hole extending inwardly of the first plate;
a second dowel pin hole extending inwardly of the second plate; and
at least one dowel pin configured to extend inwardly of the first dowel pin hole and the second dowel pin hole.

13. The multi-plate faceplate of claim 11 further comprising:
an O-ring configured to seal against the first plate and the second plate.

14. The multi-plate faceplate of claim 11 further comprising:
a channel disposed within the first plate.

15. The multi-plate faceplate of claim 11, wherein the passage has a smaller cross-sectional area than the first plate opening.

* * * * *